US012230472B1

(12) United States Patent
Mori (10) Patent No.: US 12,230,472 B1
(45) Date of Patent: Feb. 18, 2025

(54) EFFECTIVE TEMPERATURE CALCULATION METHOD FOR MULTI-CHARGED PARTICLE BEAM WRITING REGION, MULTI-CHARGED PARTICLE BEAM WRITING APPARATUS, MULTI-CHARGED PARTICLE BEAM WRITING METHOD, AND RECORDING MEDIUM RECORDING PROGRAM

(71) Applicant: NuFlare Technology, Inc., Yokohama (JP)

(72) Inventor: Shingo Mori, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 18/772,999

(22) Filed: Jul. 15, 2024

Related U.S. Application Data

(63) Continuation of application No. PCT/JP2023/037658, filed on Oct. 18, 2023.

(51) Int. Cl.
*H01J 37/317* (2006.01)
*H01J 37/304* (2006.01)

(52) U.S. Cl.
CPC ........ *H01J 37/3177* (2013.01); *H01J 37/304* (2013.01); *H01J 2237/24507* (2013.01);
(Continued)

(58) Field of Classification Search
CPC ............. H01J 37/3177; H01J 37/304; H01J 2237/24507; H01J 2237/24585; H01J 2237/31769
See application file for complete search history.

(56) References Cited

U.S. PATENT DOCUMENTS 6,379,851 B1 4/2002 Innes
10,699,877 B2 * 6/2020 Nomura ............. H01J 37/3174
(Continued)

FOREIGN PATENT DOCUMENTS

JP 2003-503837 A 1/2003
JP 2004-505462 A 2/2004
(Continued)

OTHER PUBLICATIONS

International Search Report issued Nov. 21, 2023 in PCT/JP2023/037658 filed Oct. 18, 2023 (with English Translation of Categories of Cited Documents), 3 pages.
(Continued)

*Primary Examiner* — Sean M Luck
(74) *Attorney, Agent, or Firm* — Oblon, McClelland, Maier & Neustadt, L.L.P.

(57) ABSTRACT

In an effective temperature calculation method for multi-charged particle beam writing region, at a plurality of observation times which are irradiation end times of a tracking cycle in a time domain in which a beam array region passes through a mesh region of interest, for each of the plurality of unit heat source regions around the mesh region of interest, a temperature rise amount given to the mesh region of interest is determined based on a total irradiation time of the unit heat source region, times since start of irradiation to the unit heat source region to the observation times, and a distance from the unit heat source region to the mesh region of interest, the temperature rise amount is accumulated, and accumulated values corresponding to the plurality of observation times are averaged to calculate an effective temperature of the mesh region of the interest.

5 Claims, 8 Drawing Sheets

(52) U.S. Cl.
CPC ............... *H01J 2237/24585* (2013.01); *H01J 2237/31769* (2013.01)

(56) References Cited

U.S. PATENT DOCUMENTS

| | | |
|---|---|---|
| 2002/0148978 A1 | 10/2002 | Innes et al. |
| 2014/0127628 A1 | 5/2014 | Fujimura et al. |
| 2015/0261099 A1 | 9/2015 | Yamanaka |
| 2017/0124247 A1 | 5/2017 | Fujimura et al. |

FOREIGN PATENT DOCUMENTS

| | | |
|---|---|---|
| JP | 2015-177032 A | 10/2015 |
| JP | 2017-92467 A | 5/2017 |
| JP | 2019-201071 A | 11/2019 |
| TW | 202318463 A | 5/2023 |

OTHER PUBLICATIONS

Taiwanese Office Action dated Nov. 29, 2024, issued in Taiwanese Application No. 113110497 (with English translation).

* cited by examiner

EFFECTIVE TEMPERATURE CALCULATION METHOD FOR MULTI-CHARGED PARTICLE BEAM WRITING REGION, MULTI-CHARGED PARTICLE BEAM WRITING APPARATUS, MULTI-CHARGED PARTICLE BEAM WRITING METHOD, AND RECORDING MEDIUM RECORDING PROGRAM

TECHNICAL FIELD

The present invention relates to an effective temperature calculation method for a multi-charged particle beam writing region, a multi-charged particle beam writing apparatus, a multi-charged particle beam writing method, and a recording medium recording a program.

BACKGROUND ART

With high integration of LSI, the circuit line width required for semiconductor devices are being miniaturized year by year. In order to form a desired circuit pattern on a semiconductor device, a technique is adopted in which a highly accurate original pattern formed on a quartz substrate is reduced and transferred onto a wafer using a reduction projection exposure apparatus. To produce a highly accurate original pattern, so-called electron beam lithography technique is used in which a resist is exposed to form a pattern by an electron beam writing apparatus.

As an electron beam writing apparatus, a writing apparatus using a multi-beam is being developed, which replaces a conventional single beam writing apparatus that deflects a single beam and irradiates a desired position on a sample with the beam. Many beams can be radiated using a multi-beam, as compared to when writing is performed with a single electron beam, thus the throughput can be significantly improved. In a multi-beam writing apparatus, a multi-beam is formed by passing e.g., an electron beam emitted from an electron source through a shaping aperture array member having a plurality of openings, blanking control of each beam is performed by a blanking aperture array substrate, then the beam not blocked is reduced by an optical system, and emitted to a sample placed on a movable stage.

In the writing using an electron beam, there is a problem in that when a desired irradiation energy amount is irradiated in a short time with a higher density electron beam, a phenomenon called resist heating occurs in which the substrate temperature increases excessively to change the resist sensitivity, which causes the line width accuracy to deteriorate.

For example, in single beam writing, a technique has been adopted in which the effect of temperature rise caused by each shot in the past with a single beam is accumulated, and a dose correction amount for the current shot is determined. However, since a large number of beams are used in multi-beam writing, the technique for accumulating the effect of temperature rise caused by each shot and each beam in the past requires an enormous amount of calculation. In addition, in the multi-beam writing, a plurality of beams are shot simultaneously, thus it is necessary to consider the effect of temperature rise caused by a plurality of other beams located in a wide range of region which is irradiated simultaneously.

PTL 1: Japanese Unexamined Patent Application Publication (Translation of PCT Application) No. 2003-503837

SUMMARY OF INVENTION

It is an object of the present invention to provide an apparatus and a method that are capable of calculating correction of resist heating in multi-beam writing with high accuracy and high speed.

According to one aspect of the present invention, an effective temperature calculation method for multi-charged particle beam writing region includes a step of calculating, based on writing data, a dose amount of each of a plurality of pixels into which a writing region of a sample is divided, the sample being placed on a stage which moves during pattern writing, and a step of calculating an effective temperature of a mesh region of interest as a temperature calculation target by accumulating a temperature rise amount given to the mesh region of interest by a plurality of unit heat source regions around the mesh region of interest in a time domain in which a beam array region of a multi-charged particle beam passes through the mesh region of interest. In the step of calculating the effective temperature, at a plurality of observation times which are irradiation end times of a tracking cycle in the time domain in which the beam array region passes through the mesh region of interest, for each of the plurality of unit heat source regions around the mesh region of interest, a temperature rise amount given to the mesh region of interest is determined based on a total irradiation time of the unit heat source region, times since start of irradiation to the unit heat source region to the observation times, and a distance from the unit heat source region to the mesh region of interest, the temperature rise amount is accumulated, and accumulated values corresponding to the plurality of observation times are averaged to calculate an effective temperature of the mesh region of the interest, and time integration of temperature is performed using a time structure in which irradiation of the multi-charged particle beam is pulse-like beam irradiation with a period of the tracking cycle.

ADVANTAGEOUS EFFECTS OF INVENTION

According to the present invention, correction of resist heating in multi-beam writing can be calculated with high accuracy and high speed.

DESCRIPTION OF EMBODIMENTS

Hereinafter, an embodiment of the present invention will be described based on the drawings.

Figure 1:
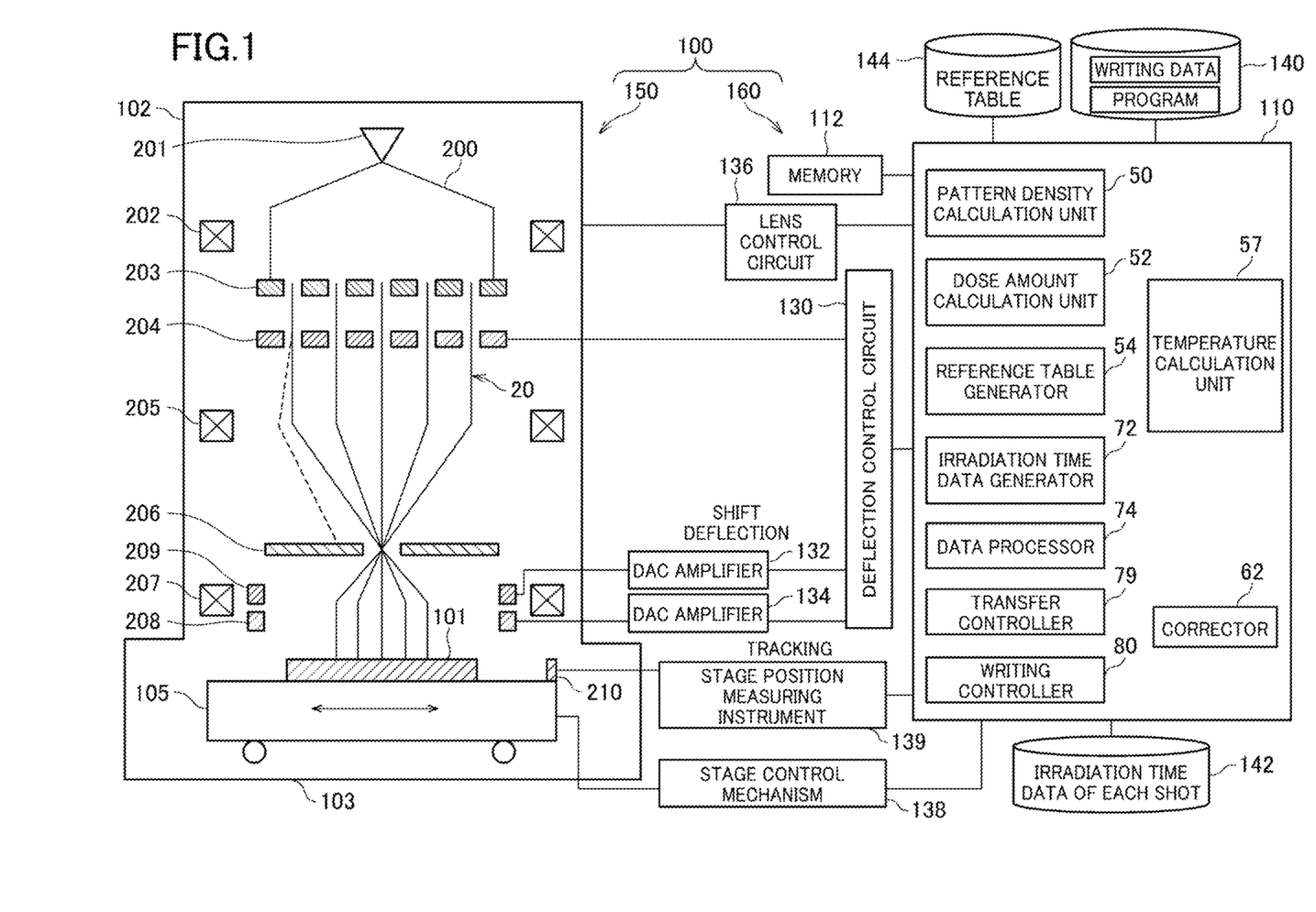
FIG. 1 is a schematic diagram of a writing apparatus according to an embodiment of the present invention.

FIG. 1 is a schematic diagram of a writing apparatus 100 according to an embodiment of the present invention. The writing apparatus 100 includes a writing mechanism 150 and a control system circuit 160. The writing apparatus 100 is an example of a multi-charged particle beam writing apparatus as well as an example of a multi-charged particle beam exposure apparatus.

In this embodiment, the configuration using an electron beam as an example of a charged particle beam will be described. However, the charged particle beam is not limited to the electron beam, and may be another charged particle beam such as an ion beam.

The writing mechanism 150 includes an electron column 102 (electron beam column) and a writing chamber 103. In the electron column 102, an electron gun 201, an illumination lens 202, a shaping aperture array substrate 203, a blanking aperture array mechanism 204, a reduction lens 205, a limiting aperture substrate 206, an objective lens 207, a main deflector 208, and a sub deflector 209 are disposed.

In the writing chamber 103, an XY stage 105 is disposed. A sample 101 such as a mask is disposed on the XY stage 105, the sample 101 serving as a writing target substrate at the time writing (at the time of exposure). The sample 101 includes an exposure mask when a semiconductor device is fabricated, and a semiconductor substrate (silicon wafer) on which a semiconductor device is fabricated. Resist is coated on the sample 101. For example, a mask blank coated with resist and nothing has been written thereon is placed on the sample 101. Furthermore, a mirror 210 to measure the position of the XY stage 105 is disposed on the XY stage 105.

The control system circuit 160 includes a control computer 110, a memory 112, a deflection control circuit 130, digital-analog conversion (DAC) amplifier units 132, 134, a lens control circuit 136, a stage control mechanism 138, a stage position measuring instrument 139 and storage devices 140, 142, 144 such as magnetic disk drives.

The control computer 110, the memory 112, the deflection control circuit 130, the lens control circuit 136, the stage control mechanism 138, the stage position measuring instrument 139 and the storage devices 140, 142, 144 are coupled to each other via a bus which is not illustrated. The deflection control circuit 130 are coupled to the DAC amplifier units 132, 134 and the blanking aperture array mechanism 204.

The sub deflector 209 is comprised of 4 or more electrodes, and is controlled by the deflection control circuit 130 via the DAC amplifier 132 for each electrode. The main deflector 208 is comprised of 4 or more electrodes, and is controlled by the deflection control circuit 130 via the DAC amplifier 134 for each electrode. The stage position measuring instrument 139 measures the position of the XY stage 105 by receiving reflected light from the mirror 210 based on the principle of laser interferometry.

In the control computer 110, a pattern density calculation unit 50, a dose amount calculation unit 52, a reference table generator 54, a temperature calculation unit 57, a corrector 62, an irradiation time data generator 72, a data processor 74, a transfer controller 79, and a writing controller 80 are disposed. Each component in the control computer 110 has a processing circuit. The processing circuit includes e.g., an electric circuit, a computer, a processor, a circuit board, a quantum circuit, or a semiconductor device.

The components may use a common processing circuit (the same processing circuit), or may use different processing circuits (separate processing circuits). Information input to or output from each component and information during calculation are stored in the memory 112.

The writing operation of the writing apparatus 100 is controlled by the writing controller 80. The process of transfer of irradiation time data of each shot to the deflection control circuit 130 is controlled by the transfer controller 79.

Writing data is input from the outside of the writing apparatus 100, and stored in the storage device 140. The writing data includes chip data and writing condition data. The chip data defines e.g. the figure code, the coordinates, and the size for each figure pattern. The writing condition data includes information indicating a multiplicity, and a stage velocity.

A storage device 144 stores the later-described reference table for obtaining a temperature rise amount given to a calculation target region (mesh region of interest) by each rectangular heat source. In this embodiment, the rectangular heat source having a rectangular unit heat source region will be described, but the shape of the unit heat source region is not limited to a rectangle.

Figure 2:
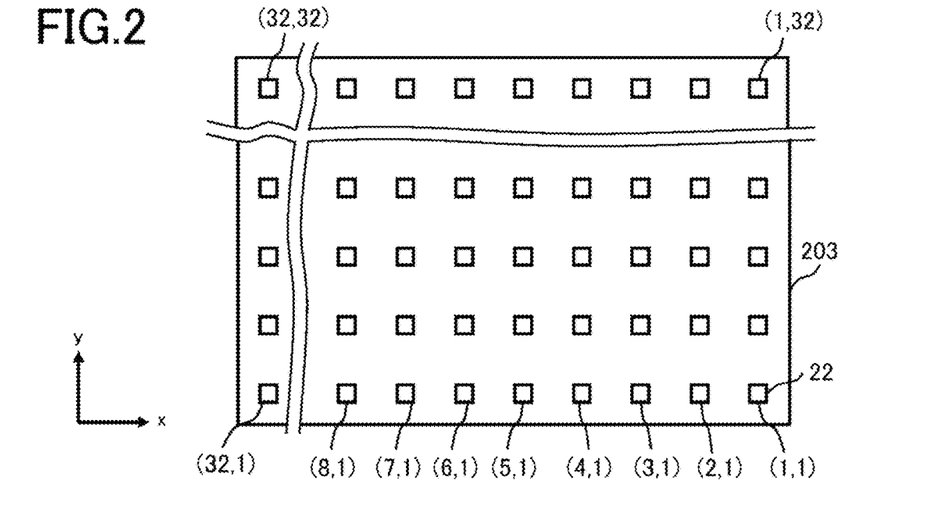
FIG. 2 is a schematic view of a shaping aperture array substrate.

As illustrated in FIG. 2, in the shaping aperture array substrate 203, a plurality of openings 22 are formed in a matrix in vertical (y direction) p rows×horizontal (x direction) q rows (p, q≥2) with a predetermined arrangement pitch. FIG. 2 illustrates an example in which the openings 22 in 32 columns×32 rows are formed horizontally and vertically (x, y directions). The openings 22 are formed as rectangles or circles having the same dimensional shape. Multi-beams 20 are formed by passing part of the electron beam 200 through the plurality of openings 22.

In the blanking aperture array mechanism 204, passage holes are formed corresponding to the arrangement positions of the openings 20 of the shaping aperture array substrate 203, and a blanker consisting of two electrodes as a pair is disposed in each passage hole. The multi-beams 20 passing through respective passage holes are each deflected independently by a voltage applied to a blanker. Blanking control is performed on each beam by the deflection. In this manner, blanking deflection is performed by the blanking aperture array mechanism 204 on each beam of the multi-beams 20 passing through the plurality of openings 22 of the shaping aperture array substrate 203.

Next, a specific example of an operation of the writing mechanism 150 will be described. The electron beam 200 emitted from the electron gun 201 (emission source) illuminates the shaping aperture array substrate 203 in its entirety substantially perpendicularly by the illumination lens 202. The electron beam 200 illuminates a region including the plurality of openings 22 of the shaping aperture array substrate 203. Part of the electron beam 200 radiated to the positions of the plurality of openings 22 passes through the openings 22, thereby forming multi-beams (plurality of electron beams) 20 with a rectangular beam array shape, for example.

The multi-beams 20 pass through respective corresponding blankers of the blanking aperture array mechanism 204. The blankers individually perform blanking control on passing beams so that the beams achieve ON state during a defined writing time (irradiation time).

The multi-beams 20 which have passed through the blanking aperture array mechanism 204 are reduced by the reduction lens 205, and travel to a hole formed in the center of the limiting aperture substrate 206. An electron beam deflected by a blanker of the blanking aperture array mechanism 204 is displaced from the hole in the center of the limiting aperture substrate 206, and blocked by the limiting aperture substrate 206. In contrast, an electron beam not deflected by any blanker of the blanking aperture array mechanism 204 passes through the hole in the center of the limiting aperture substrate 206 as illustrated in FIG. 1.

In this manner, the limiting aperture substrate 206 blocks each beam which has been deflected by a blanker to achieve beam OFF state. The beam formed during a period from beam ON to beam OFF by passing through the limiting aperture substrate 206 provides the beam for a single shot The multi-beams 20 which have passed through the limiting aperture member 206 are focused by the objective lens 207, and form a pattern image with a desired reduction factor, and the entire multi-beams 20 which have passed through the limiting aperture substrate 206 are collectively deflected by the main deflector 208 and the sub deflector 209 in the same direction, and emitted to respective irradiation positions of the beam on the sample 101.

For example, when the XY stage 105 is continuously moved, tracking control is performed by deflecting the multi-beams 20 with the main deflector 208 so that the irradiation position of each beam follows the movement of the XY stage 105.

The multi-beams 20 emitted at one time are ideally arranged with the pitch which is the product of the arrangement pitch of the plurality of openings 22 of the shaping aperture array substrate 203 and the above-mentioned desired reduction factor.

Figure 3:
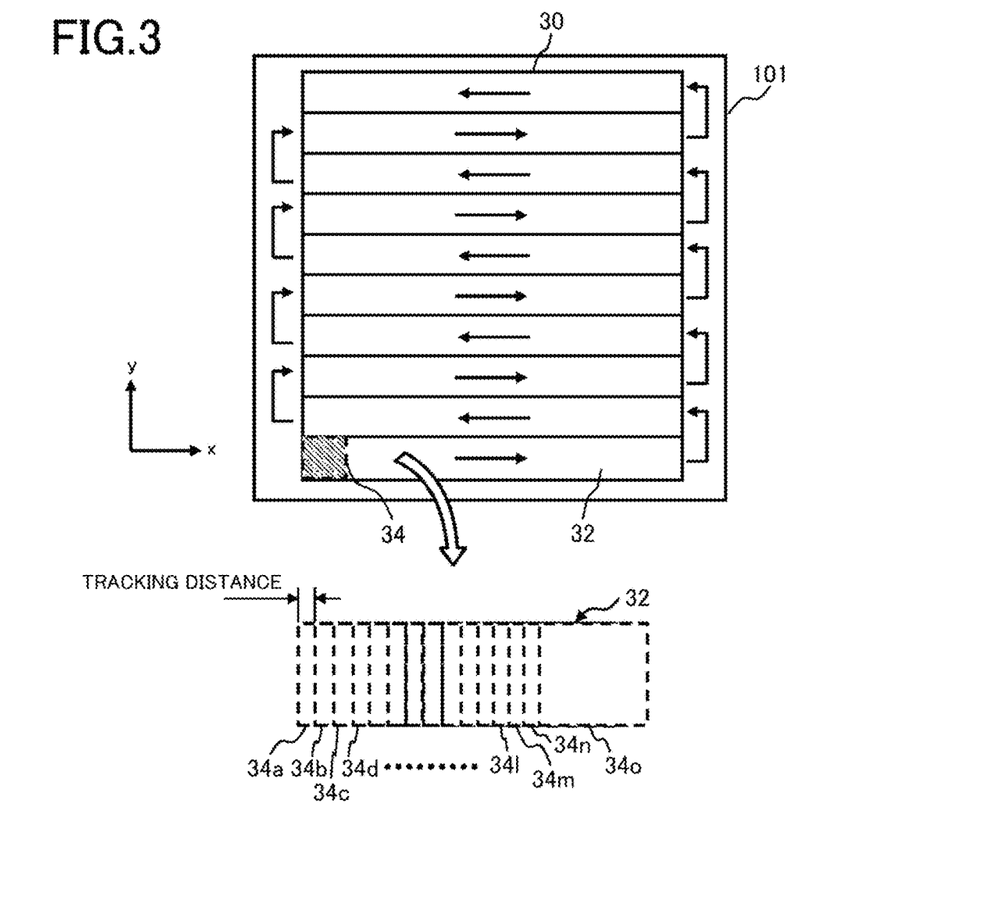
FIG. 3 is a view for explaining an example of a writing operation.

FIG. 3 is a conceptual view for explaining an example of a writing operation. As illustrated in FIG. 3, a writing region 30 of the sample 101 is virtually divided into e.g., a plurality of stripe regions 32 in rectangular form with a predetermined width in the y direction. First, the XY stage 105 is moved, and adjustment is made so that an irradiation region 34 which can be irradiated with a single shot of the multi-beams 20 is located at the left end of the first stripe region 32, and writing is started.

When the first stripe region 32 is written, the XY stage 105 is moved e.g., in-x direction, thus writing proceeds relatively in +x direction. The XY stage 105 is continuously moved at a constant speed, for example. After writing on the first stripe region 32 is finished, the stage position is moved in −y direction, and this time, the XY stage 105 is moved e.g., in +x direction, thus writing is similarly performed in −x direction.

Such an operation is repeated to perform writing on the stripe regions 32 sequentially. The writing time can be reduced by performing writing while alternately changing the direction. However, without being limited to the case where writing is performed while alternately changing the direction, the writing may proceed in the same direction when writing is performed on the stripe regions 32.

When the XY stage 105 is moved at a constant speed, the continuous movement velocity may vary with stripe. At most a plurality of shot patterns with the same number of the openings 22 are formed at a time by a single shot of the multi-beams formed by passing through the openings 22 of the shaping aperture array substrate 203.

Figure 4:
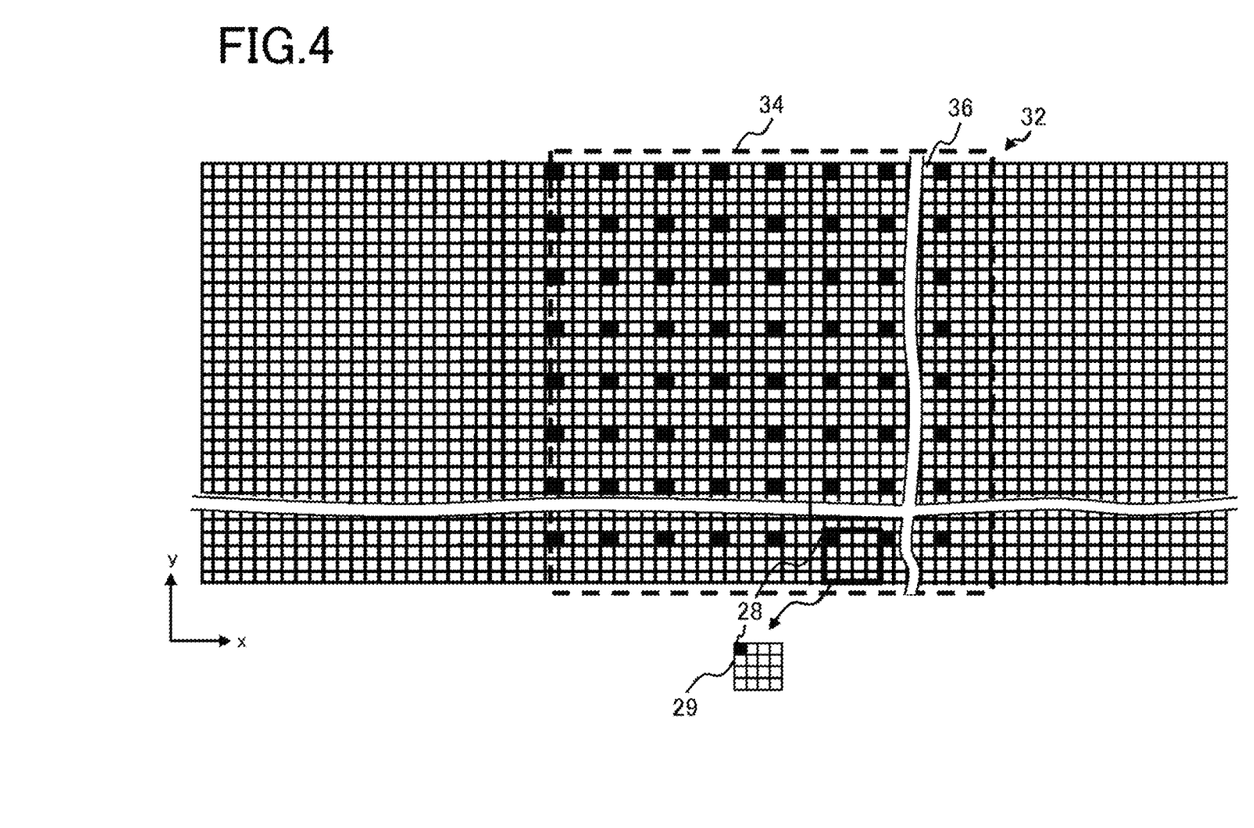
FIG. 4 is a view illustrating an example of an irradiation region and writing target pixels of multi-beam.

FIG. 4 is a view illustrating an example of an irradiation region and writing target pixels of multi-beam. In FIG. 4, the stripe region 32 is divided into a plurality of mesh regions in a mesh shape with e.g., the size of each individual beam included in the multi-beams 20. Each mesh region is a pixel 36 (a unit irradiation region, an irradiation position, or a writing position) as a writing target. The size of the pixel 36 as a writing target is not limited to the beam size, and may be any value regardless of the beam size. For example, the pixel size may be 1/a (a is an integer greater than or equal to 1) of the beam size.

The example of FIG. 4 shows the case where the writing region 30 of the sample 101 is divided into a plurality of stripe regions 32, for example, in the y direction with substantially the same width size as the size of the irradiation region 34 (beam array region) which can be irradiated with one shot of the multi-beams 20. The size of the rectangular irradiation region 34 in the x direction can be defined by the number of beams in the x direction×the pitch between beams in the x direction. The size of the rectangular irradiation region 34 in the y direction can be defined by the number of beams in the y direction×the pitch between beams in the y direction.

In the irradiation region 34, a plurality of pixels 28 (writing positions of the beam) which can be irradiated with a single shot of the multi-beams 20 are shown. The pitch between adjacent pixels 28 on the sample surface gives the pitch between beams of the multi-beams 20. A rectangular region surrounded with the size of beam pitch in the x, y direction forms one sub irradiation region 29 (pitch cell). Each sub irradiation region 29 includes one pixel 28. In the example of FIG. 4, for example, the pixel at the upper left corner of each sub irradiation region 29 is shown as the pixel 28 at the writing position of the beam.

Each sub irradiation region 29 is constituted by e.g., 10×10 pixels. In FIG. 4, each sub irradiation region 29 consisting of 10×10 pixels is shown as 4×4 pixels in a simplified manner.

Figure 5:
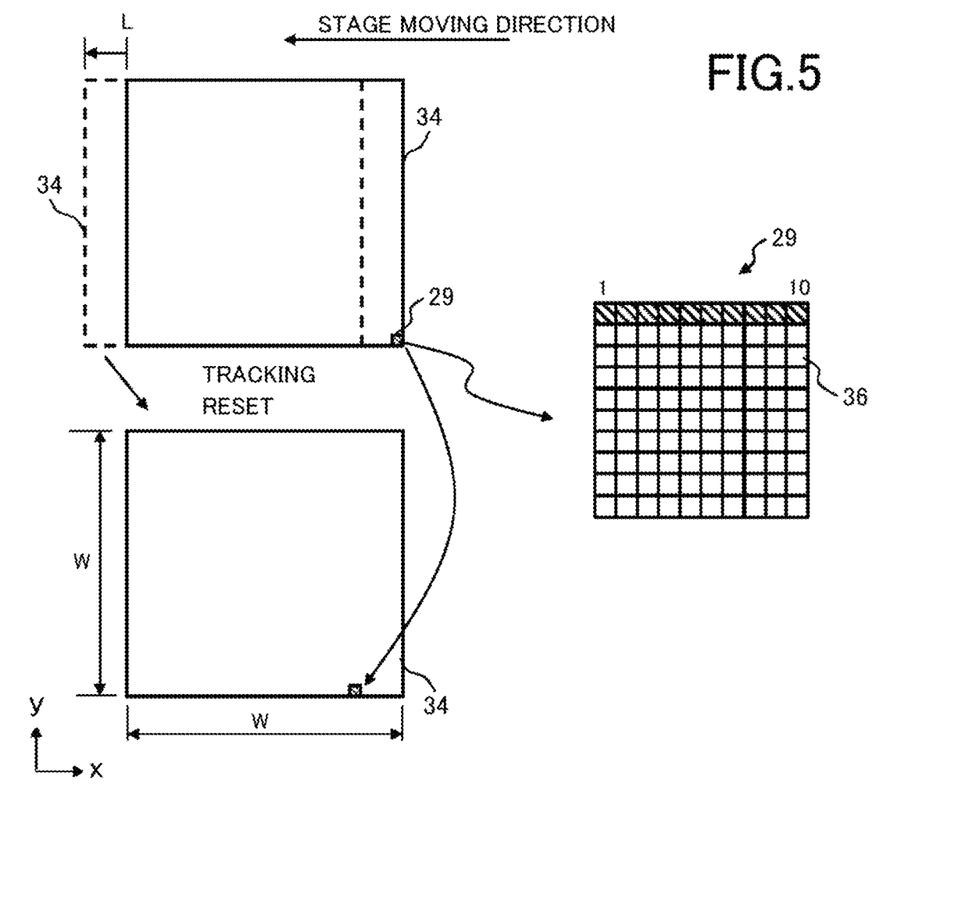
FIG. 5 is a view for explaining an example of a multi-beam writing operation.

FIG. 5 illustrates an example of a multi-beam writing operation. The example of FIG. 5 shows the case where writing is performed by 10 different beams in each sub irradiation region 29 on the sample 101 surface. The example of FIG. 5 shows a writing operation of continuous movement with a speed at which the XY stage 105 moves distance L of e.g., 25 beam pitches while writing is performed on 1/10 (the reciprocal of the number of beams used for irradiation) region in each sub irradiation region 29.

The writing operation illustrated in the example of FIG. 5 shows the case where 10 different pixels in the same sub irradiation region 29 are written (exposed) by providing 10 shots of the multi-beams 20 in a shot cycle time while the irradiation position (pixel 36) is being shifted sequentially by the sub deflector 209 during movement of the XY stage 105 for the distance L of 25 beam pitches, for example.

In order to prevent displacement in the relative position of the irradiation region 34 with respect to the sample 101 due to the movement of the XY stage 105 while 10 pixels are being written (exposed), the irradiation region 34 is made to follow the movement of the XY stage 105 by collectively deflecting the entire multi-beams 20 using the main deflector 208. In other words, tracking control is performed. Thus, the distance L for which collective deflection is performed by the main deflector 208 during single tracking control gives the tracking distance.

When one tracking cycle is completed, the tracking is reset, and returned to the previous tracking start position. Since writing for the first pixel row from the top of each sub irradiation region 29 is completed, after the tracking is reset, in the next tracking cycle, the sub deflector 209 deflects the beam to shift the writing position so that writing is performed on an unexposed pixel row of each sub irradiation region 29, for example, the second pixel row from the top.

In this manner, the pixel row to be written is changed for each reset of the tracking. Each pixel 36 in each sub irradiation region 29 is written once while the tracking control is performed 10 times. While the stripe region 32 is being written, such an operation is repeated, thus as illustrated in FIG. 3, the position of the irradiation region 34 is sequentially moved like irradiation regions 34a to 34o so that the writing on the stripe region 32 is performed.

In the example of FIG. 5, in the second tracking control, the sub irradiation region 29 on the sample surface, located at the lower right corner of the irradiation region 34 with width W has moved to the position away from the lower right corner of the irradiation region 34 by the distance L in the left direction. Thus, in the second tracking control, the sub irradiation region 29 located at the lower right corner of the irradiation region 34 in the first tracking control is written by another beam at the position away from the lower right corner of the irradiation region 34 by the distance L in the left direction. Here, writing is performed by the beam away from the beam at the lower right corner by the distance of 25 pixels (the distance L of 25 beam pitches) in-x direction, for example.

For example, in a writing process in which the multiplicity per stage 1 pass is set to 2, each pixel 36 in each sub irradiation region 29 is written twice by the tracking control performed 20 times.

In the multi-beam writing, a large number of beams are used, thus resist heating occurs. In this embodiment, the temperature rise value given by peripheral beam irradiation regions is calculated with high speed and high accuracy, the dose amount is corrected based on the temperature rise value, and the effect by the resist heating is corrected.

Figure 6:
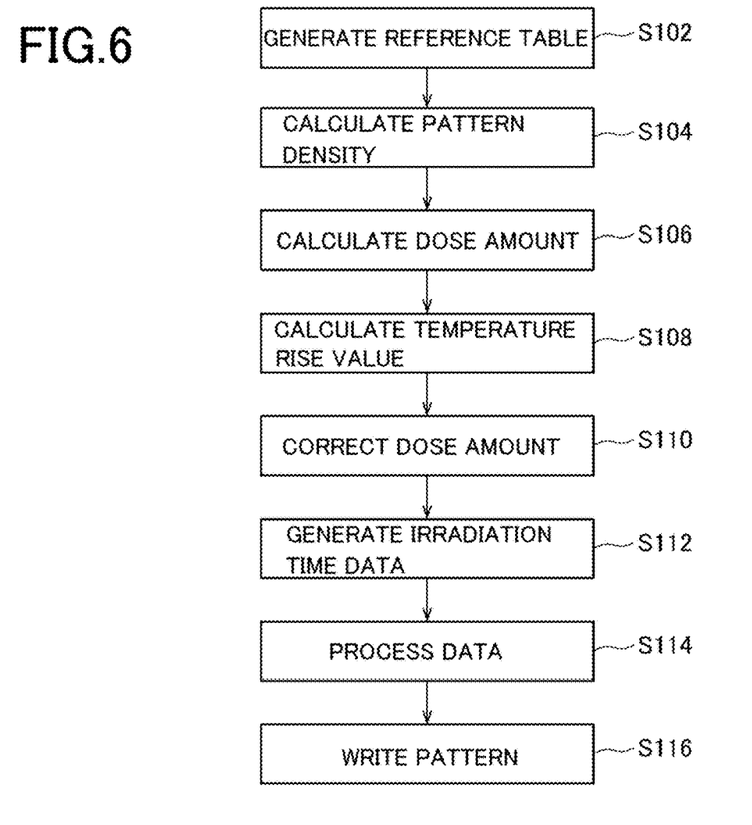
FIG. 6 is a flowchart for explaining a multi-charged particle beam writing method according to the embodiment.

FIG. 6 is a flowchart for explaining a writing method according to the embodiment of the present invention. The writing method includes a reference table generation process (S102), a pattern density calculation process (S104), a dose amount calculation process (S106), a temperature rise value calculation process (S108), a dose amount correction process (S110), an irradiation time data generation process (S112), a data processing process (S114), and a writing process (S116).

First, in the reference table generation process (S102), the reference table generator 54 generates a three-dimensional reference table and stores it in the storage device 144, the three-dimensional reference table defining the temperature generated by one rectangular heat source to the peripheral mesh regions for a plurality of combinations of a total irradiation time ($\Delta t_{shot}$) of the rectangular heat source, an observation time ($t_{obs}$) with respect to the start time of irradiation to the rectangular heat source, and a distance (x) from the rectangular heat source center. The size and shape of the rectangular heat source and mesh regions are not limited to specific values, but may be e.g., a square with each side of the distance of 25 beam pitches of the multi-beams. The observation time ($t_{obs}$) with respect to the start time of irradiation to the rectangular heat source is, in other words, the time elapsed since irradiation to the rectangular heat source started until the observation time ($t_{obs}$).

The elements of the reference table are calculated as $T_d(x, y, t=t_{obs}, \Delta t_{shot})$ using the following Expressions (1), (2). To reduce the dimension of the reference table, it is assumed that y=0. $T_d(x, y=0, t=t_{obs}, \Delta t_{shot})$ indicates a temperature rise value given to the position away by distance x (y is 0) at observation time $t_{obs}$ when the rectangular region with the center at the origin position is irradiated with a rectangular continuous beam from time 0 to time $\Delta t_{shot}$.

Expression (1)

$$T_d(x, y, t = t_{obs}, \Delta t_{shot}) = \sum_{i_{BAS}=0}^{N_{BAS}-1} \int_{t'=t_0(i_{BAS})}^{t_0(i_{BAS})+\Delta t_{pass}/N_{BAS}} dt' \frac{dT}{dt}(x, y, t, t', p) \theta(t_{obs} - t')$$

$$\Delta t_{shot} = \frac{D_{PEC}}{N_{multi} \cdot J_{curr}}$$

$$t_0(i_{BAS}) = i_{BAS} \cdot \frac{\Delta t_{shot}}{N_{BAS}}$$

$$\Delta t_{pass} = \frac{L_{BA}}{v_{stage}}$$

Expression (2)

$$\frac{dT(x, y, t, t', p)}{dt} =$$

$$\frac{2P}{\rho C_p}\left(Erf\left(\frac{p-x}{2\sqrt{\alpha(t-t')}}\right) + Erf\left(\frac{p+x}{2\sqrt{\alpha(t-t')}}\right)\right)$$

$$\left(Erf\left(\frac{p-y}{2\sqrt{\alpha(t-t')}}\right) + Erf\left(\frac{p+y}{2\sqrt{\alpha(t-t')}}\right)\right)$$

$$\frac{1}{2}Erf\left(\frac{R_g}{2\sqrt{\alpha(t-t')}}\right)$$

In the above-stated Expression (1), $D_{PEC}$ indicates an irradiation amount after proximity effect correction (PEC). $N_{multi}$ indicates a stripe multiplicity (the number of overwriting in multiple writing).

$J_{curr}$ indicates a current density.

$\theta(t_{obs}-t')$ indicates a Heaviside function (step function). The effect in the region future than the observation time $t_{obs}$ from the integral range with respect to irradiation time t' is eliminated. When t<0, θ(t)=0, and when t≥0, θ(t)=1.

Figure 7:
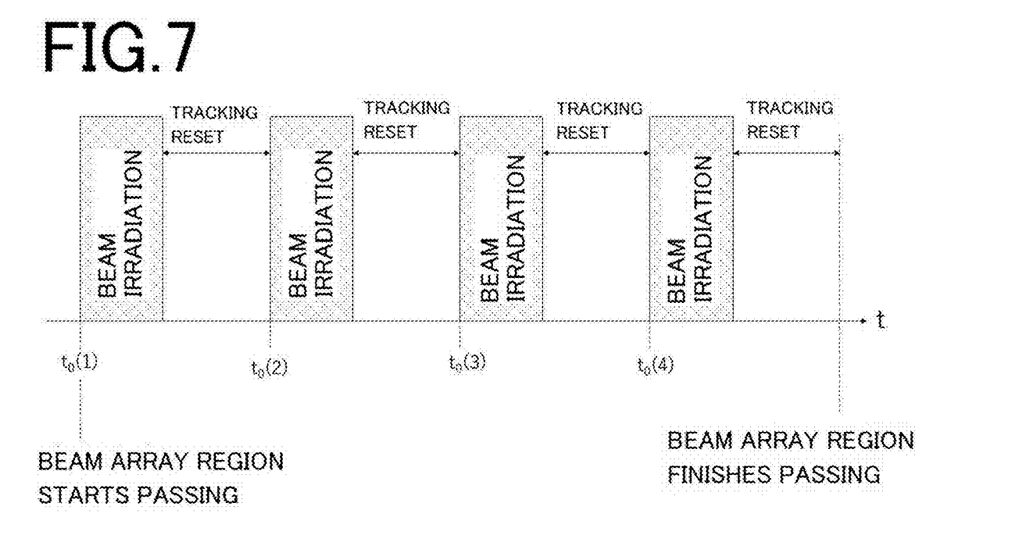
FIG. 7 is a chart illustrating beam irradiation timing.

$N_{BAS}$ indicates the number of tracking cycles for advancement in the x direction by one beam array region. FIG. 7 indicates the timing of beam irradiation while the beam array region passes through the rectangular region when $N_{BAS}$=4. As described above, during tracking control, the irradiation region 34 follows the movement of the XY stage 105, and is irradiated with the beam. While the tracking is reset, and the beam is returned to the previous tracking start position, beam irradiation is not performed. The total of beam irradiation times corresponds to the aforementioned $\Delta t_{shot}$.

$t_0(i_{BAS})$ indicates the irradiation start time in $i_{BAS}$th tracking cycle. For example, when $N_{BAS}$=4, $i_{BAS}$ in FIG. 7 takes the value of 1 to 4, and $t_0(i_{BAS})$ shows the time indicated by $t_0(1)$, $t_0(2)$, $t_0(3)$, $t_0(4)$.

$L_{BA}$ indicates the length of one beam array region.

$\Delta t_{pass}$ indicates the time required for the beam array region to advance by $L_{BA}$. In other words, $\Delta t_{pass}$ corresponds to the time required for tracking cycles for $N_{BAS}$ times.

$V_{stage}$ indicates a stage velocity.

In the above-stated Expression (2), ρ indicates the size of rectangular heat source.

dT/dt indicates an analytical solution obtained from a thermal diffusion equation when a rectangular heat source is assumed to be provided.

P indicates an input power density of the rectangular heat source.

ρ indicates the mass density of the sample 101.

$C_p$ indicates the specific heat of the sample 101.

α indicates the thermal diffusion coefficient of the sample 101.

Erf indicates an error function.

t indicates a relative observation time with respect to an irradiation start time.

t' indicates an irradiation time over which integration is performed.

As shown in Expression (1), in the temperature calculation according to this embodiment, irradiation with multi-beams is not treated as irradiation with a continuous beam, but treated as irradiation with pulse-shaped beam with a period of tracking cycle, and time integration of temperature adopting a pulse-shaped time structure is performed.

A temperature rise amount (time integration) is calculated using the above-stated Expression (1), (2) for each of a plurality of combinations with the values of x, $t_{obs}$, $\Delta t_{shot}$ changed, and a reference table is generated which defines the temperature rise value corresponding to each combination of x, $t_{obs}$, $\Delta t_{shot}$.

In the reference table, the range of x for defining the temperature rise amount is, for example, from zero to 3 times the beam array region, and the interval of x for defining the temperature rise amount is, for example, the temperature mesh size. In the reference table, the range of $t_{obs}$ for defining the temperature rise amount is, for example, from zero to twice the passage time of the beam array, and the interval of $t_{obs}$ for defining the temperature rise amount is, for example, 1/10 of the passage time of the beam array. In the reference table, the range of $\Delta t_{shot}$ for defining the temperature rise amount is, for example, the time obtained by dividing the maximum irradiation amount per stage 1 pass by the current density, and the interval of $\Delta t_{shot}$ for defining the temperature rise amount is, for example, 1/20 of the maximum value.

Figure 8:
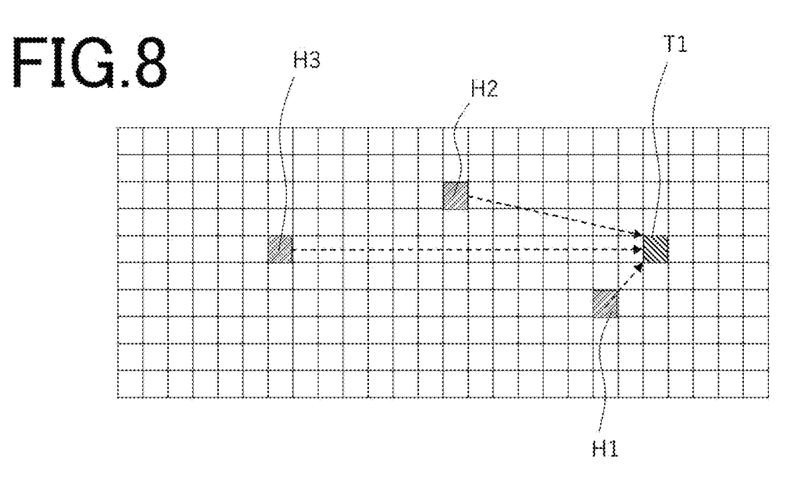
FIG. 8 is a view illustrating an example of a rectangular heat source which contributes to temperature rise of a mesh region of interest.

As illustrated in FIG. 8, at observation time $t_{obs}$ with respect to the start time of irradiation to rectangular heat source H1, the temperature generated by the rectangular heat source H1 to calculation target region T1 (mesh region of interest) can be obtained by extracting, from the reference table, a temperature rise value corresponding to the distance from the center of the rectangular heat source H1 to the center of the calculation target region T1, the total irradiation time of the rectangular heat source H1 up to the observation time $t_{obs}$, and the observation time $t_{obs}$. The temperatures generated by the rectangular heat sources H2, H3 to the calculation target region T1 are also similarly obtained.

Figure 9:
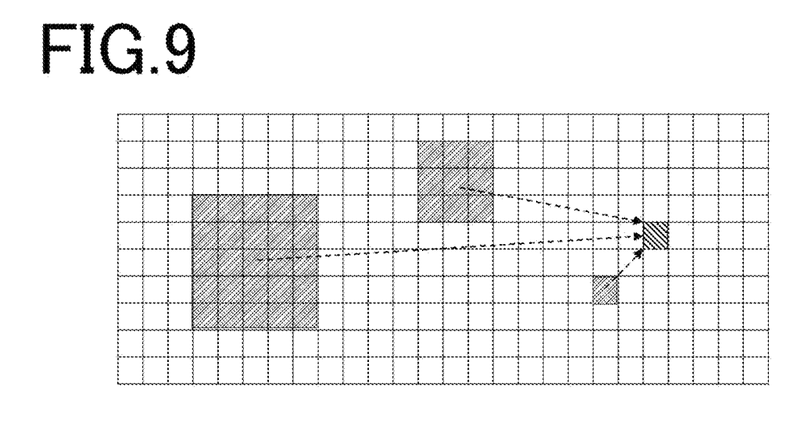
FIG. 9 is a view illustrating an example of a rectangular heat source which contributes to temperature rise of a mesh region of interest.

In the example illustrated in FIG. 8, a reference table is generated by assuming that the size of each rectangular heat source is constant regardless of the distance from the calculation target region T1. The heat generated by a time-wise, space-wise remote heat source, and the heat generated by peripheral heat sources are averaged, thus as illustrated in FIG. 9, a reference table may be generated by increasing the size of a rectangular heat source for a longer distance from the calculation target region T1 (for further away from the calculation target region T1).

Figure 10:
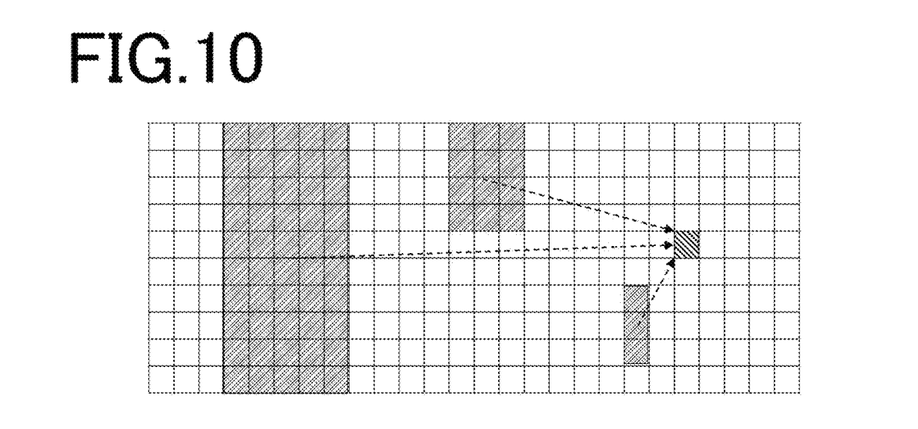
FIG. 10 is a view illustrating an example of a rectangular heat source which contributes to temperature rise of a mesh region of interest.

In the multi-beam writing, the temperature distribution spreads in the y direction, thus as illustrated in FIG. 10, a reference table may be generated by assuming that the shape of a rectangular heat source is a rectangle with a longer side in the y direction.

In the pattern density calculation process (S104), the pattern density calculation unit 50 reads writing data from the storage device 140 for each stripe region 32, and calculates a pattern density (area density of pattern) for each pixel 36 in the target stripe region 32. The pattern density calculation unit 50 generates a pattern density map for each stripe region 32 using the calculated pattern density of each pixel 36. The pattern density of each pixel 36 is defined as an element of the pattern density map. The generated pattern density map is stored in the storage device 144.

In the dose amount calculation process (S106), for each pixel 36, the dose amount calculation unit 52 calculates a dose amount (irradiation amount) for irradiating the pixel 36. The dose amount may be calculated, for example, by multiplying a predetermined reference irradiation amount by a proximity effect correction irradiation coefficient and a pattern density. In this manner, the dose amount is preferably determined in proportion to the pattern area density calculated for each pixel 36.

In the calculation of the proximity effect correction irradiation coefficient, first, a writing region (here, for example, a stripe region 32) is virtually divided into a plurality of proximity mesh regions (mesh regions for proximity effect correction calculation) in a mesh shape with a predetermined size. The size of each proximity mesh region is preferably set to approximately 1/10 of the range affected by proximity effect, e.g., approximately 1 μm. Writing data is then read from the storage device 140, and for each proximity mesh region, the pattern area density of a pattern disposed in the proximity mesh region is calculated. A proximity effect correction irradiation coefficient for correcting the proximity effect is calculated based on the pattern area density of the proximity mesh region. The calculation technique for the proximity effect correction irradiation coefficient may be the same as the technique used in a conventional single beam writing method.

The dose amount calculation unit 52 then generates a dose map (1) for each stripe region 32 using the calculated dose amount of each pixel 36. The dose amount of each pixel 36 is defined as an element of the dose map (1). The generated dose map (1) is stored in the storage device 144.

In the temperature rise value calculation process (S108), the temperature calculation unit 57 calculates a temperature rise value at the observation time $t_{obs}$ by adding all contributions to temperature rise from the peripheral rectangular heat sources for a mesh region (mesh region of interest) as a calculation target for temperature rise value. For each of peripheral rectangular heat sources, the temperature calculation unit 57 obtains a temperature rise value from the reference table using the irradiation amount determined from the dose map (1), the distance to the mesh region of interest, and a relative observation time measured since the irradiation start, and adds up the temperature rise values due to the rectangular heat sources. The obtaining of temperature rise values from the reference table includes interpolation and extrapolation.

For example, using the above-stated Expression (3), the temperature rise values due to peripheral rectangular heat sources are obtained from the reference table, and added up.

$$(x, t) = (p \cdot ix, t_{obs}) \qquad \text{Expression (3)}$$

$$T(ix, iy, r_t) = \sum_{iy'=0}^{N_y-1} \sum_{ix'=0}^{ix+L_{BA}/p} Td(r, 0, t_{obs} - t_0(ix'), \Delta t_{shot})$$

-continued $$r = p\sqrt{(ix' - ix)^2 + (iy' - iy)^2}$$

$$\Delta t_{shot}(ix', iy') = \frac{D(ix', iy')}{N_{multi} \cdot J_{curr}}$$

$$t_{obs} = \frac{p \cdot ix}{v_{stage}} + \Delta t_{pass} \cdot r_t$$

In Expression (3), ix, iy correspond to the coordinates of the mesh region of interest among the mesh indices of the stripe regions in the x direction, y direction. Let p be the size of the mesh region of interest, then the coordinate of the mesh region of interest in the x direction is p·ix.

$t_{obs}$ indicates an observation time with the irradiation start time for the stripe region at the origin.

$r_t$ is the time which has elapsed since the start of beam irradiation to the mesh region of interest and is measured using beam array region passage time $\Delta t_{pass}$ as the unit, and has a value in the range of 0 to 1.

T (ix, iy, $r_t$) indicates a temperature rise value at relative time $r_t$ in the mesh region of interest.

ix', iy' are indices in mesh coordinates indicating the rectangular heat sources in the periphery of the mesh region of interest.

$N_y$ indicates the number of rectangular heat sources in the y direction in the stripe region.

r indicates the distance between the mesh region of interest and a rectangular heat source.

$t_{obs} - t_0$ (ix') indicates a relative observation time measured since the start of irradiation of the rectangular heat source at the position of ix'.

$\Delta t_{shot}$ indicates the total irradiation time of the rectangular heat source at the position (ix', iy').

Figure 11:
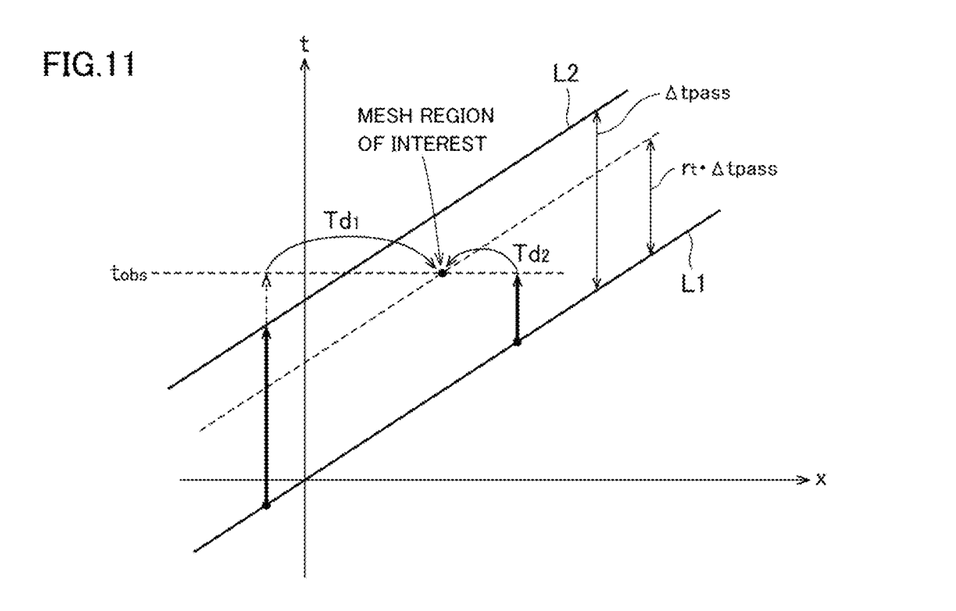
FIG. 11 is a conceptual graph showing the sum of a temperature rise value caused by a plurality of rectangular heat sources.

FIG. 11 is a conceptual graph for explaining the sum of temperature rise values due to peripheral rectangle heat sources. The horizontal axis of FIG. 11 indicates an axis parallel to the travel direction of the beam array region. Straight line L1 indicates the head position of the beam array region, and straight line L2 indicates the rear end position of the beam array region. The interval between the straight line L1 and the straight line L2 corresponds to the size of the beam array region. In actual writing, the period of advancement of one beam array region includes a plurality tracking cycles, but in FIG. 11, for the purpose of illustration, modeling is performed under the assumption that the beam array region is in a uniform linear motion on the sample surface.

The temperature rise value in the mesh region of interest at the observation time $t_{obs}$ is the sum of temperature rise values $T_{d1}$, $T_{d2}$ due to the peripheral rectangle heat sources.

The temperature calculation unit 57 calculates and averages T (ix, iy, $r_t$) at predetermined time intervals in the time domain in which the beam array region passes through the mesh region of interest, and calculates an effective temperature of the mesh region of interest.

For example, the temperature calculation unit 57 calculates T (ix, iy, $r_t$) at the irradiation end time of each tracking cycle, and averages T (ix, iy, $r_t$) to calculate an effective temperature of the mesh region of interest. For example, when $N_{BAS}$=4 (see FIG. 7), T (ix, iy, $r_t$) is calculated at four observation times, and averaged.

An effective temperature map in the stripe region is obtained by repeating such calculation.

In the dose amount correction process (S110), the corrector 62 corrects the dose amount of a plurality of beams for irradiating the mesh region of interest, using the effective temperature, and a modulation factor showing a dose change amount per unit temperature. The modulation factor is calculated in advance based on line width change amount in writing pattern per unit temperature of a substrate, and line width change amount per unit dose, and stored in the storage device 144.

The corrector 62 retrieves the dose amount of the pixel 36 from the dose map (1), determines a correction amount by multiplying the effective temperature of the mesh region of interest including the pixel 36 by the modulation factor, and calculates a correction dose amount by subtracting the correction amount from the retrieved dose amount. The corrector 62 then generates a dose map (2) for each stripe region 32 using the calculated correction dose amount of each pixel 36. The correction dose amount of each pixel 36 is defined as an element of the dose map (2). Thus, a dose distribution after the correction (after the modulation) is determined. The generated dose map (2) is stored in the storage device 144

In the irradiation time data generation process (S112), for each pixel 36, the irradiation time data generator 72 calculates an irradiation time of the electron beam for emitting the correction dose calculated for the pixel 36. The irradiation time can be calculated by dividing the correction dose amount by a current density. The irradiation time of each pixel 36 is calculated as a value less than or equal to a maximum irradiation time during which irradiation can be made by 1 shot of the multi-beams 20. The irradiation time of each pixel 36 is converted to data of gradation value of 0 to 1023, where a maximum irradiation time is 1024 gradations (10 bits), for example. The gradated irradiation time data is stored in the storage device 142.

In the data processing process (S114), the data processor 74 rearranges the irradiation time data in the shot order in a writing sequence.

In the writing process (S116), under the control of the writing controller 80, the transfer controller 79 transfers the irradiation time data to the deflection control circuit 130 in the shot order. The deflection control circuit 130 outputs a blanking control signal to the blanking aperture array mechanism 204 in the shot order, and outputs a deflection control signal to the DAC amplifier units 132, 134 in the shot order. The writing mechanism 150 then writes a pattern on the sample 101 using the multi-beams 20 with dose amounts each corrected using an effective temperature.

As described above, according to this embodiment, the calculation cost for the temperature between the mesh region of interest and rectangular heat sources can be limited to the reading of temperature rise value from the reference table and interpolation, thus correction on resist heating in the multi-beam writing can be calculated with high accuracy and high speed.

The technique according to the above-described embodiment is applicable not only to the case where the stage velocity is uniform, but also the case where the stage velocity is variable. When the stage velocity is uniform, the head position, rear end position of the beam array region are represented by straight lines (e.g., the straight lines L1, L2 in FIG. 11) in a topological space; however, when the stage velocity is variable, those positions are represented by polygonal lines or curves instead of straight lines.

Figure 12A:
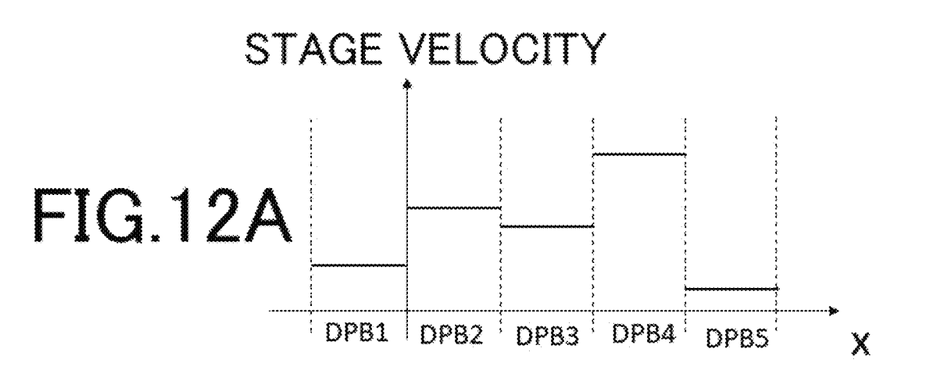
FIG. 12A is a graph illustrating a stage velocity distribution.

For example, a stripe region is divided into a plurality of block-shaped calculation processing unit regions (DPB regions) in the x direction, and a writing time is calculated for each DPB region. The stage velocity is calculated for each DPB region based on the writing time and the width of the DPB region to determine a stage velocity distribution in the stripe region as illustrated in FIG. 12A.

Figure 12B:
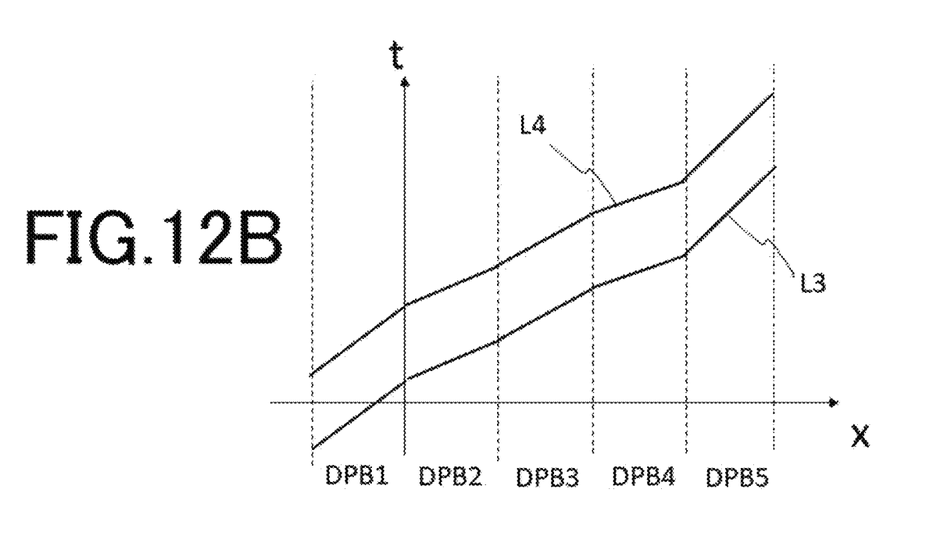
FIG. 12B is a graph illustrating a beam array region in a topological space.

Based on the stage velocity distribution, a topological space of the beam array region as illustrated in FIG. 12B is obtained. In FIG. 12B, the polygonal line L3 represents the head position of the beam array region, and the polygonal line L4 represents the rear end position of the beam array region. The total irradiation time of the rectangular heat sources in the periphery of the mesh region of interest, and the time since each irradiation start to the observation time are determined from the topological space, and a temperature rise amount corresponding to these times and the distance from each rectangular heat source to the mesh region of interest is obtained from the reference table, and accumulated to calculate an effective temperature of the mesh region of interest.

In the case where tracking cycle is considered, a step topological space may be used.

In the above-described embodiment, an example has been described in which T (ix, iy, $r_t$) is calculated at predetermined time intervals, and averaged in the time domain in which the beam array region passes through the mesh region of interest to determine an effective temperature of the mesh region of interest; however, T (ix, iy, $r_t$) may be calculated at predetermined time intervals in the time domain in which backscattered electrons can reach the mesh region of interest.

T (ix, iy, $r_t$) may be calculated at a single observation time immediately after the beam array region passes through the mesh region of interest, and the calculated T (ix, iy, $r_t$) may be regarded as an effective temperature of the mesh region of interest.

In the above-described embodiment, the configuration has been described in which an effective temperature of the mesh region of interest is calculated, and resist heating is corrected by the correction of dose amount based on the effective temperature; however, the technique to correct resist heating is not limited to this. For example, the resist heating may be corrected by resizing the figure pattern itself to be written based on the calculated effective temperature.

In this case, correlation data which approximates the CD change amount ΔCD per unit temperature ΔT is stored in the storage device 144. The corrector 62 refers to the correlation data, and calculates a correction amount by multiplying the effective temperature of the mesh region of interest by the dimensional change amount (ΔCD/ΔT) of the pattern. The corrector 62 then uses the correction amount to resize the size of the figure pattern. The data of each resized figure pattern is stored in the storage device 144.

The pattern density calculation unit 50 uses the data of the resized figure pattern to calculate a pattern density ρ (area density of the pattern) for each pixel 36 in the target stripe region 32, and generates a pattern density map. The dose amount calculation unit 52 uses the pattern density map, and for each pixel 36, calculates a dose amount (irradiation amount) for irradiating the pixel 36 to generate a dose map.

For each pixel 36, the irradiation time data generator 72 calculates an irradiation time t of the electron beam for emitting a dose amount after the resizing correction calculated for the pixel 36. The irradiation time t can be calculated by dividing the dose amount by a current density. The irradiation time data is stored in the storage device 142. Subsequently, processes similar to the data processing process (S114) and the writing process (S116) in FIG. 6 are performed, thus the resized pattern is written on the sample 101. Resist heating can be corrected by the resizing process.

A program to implement at least part of the function of the control computer 110 explained in the above-described embodiment may be stored in a non-transitory recording medium such as a CD-ROM, and read by a computer (CPU) which may be caused to execute the program. The recording medium is not limited to a removable recording medium, such as a magnetic disk or an optical disk, and may be a fixed recording medium, such as a hard disk drive and a memory. FIG. 1 illustrates an example in which a program is stored in the storage device 140.

Although the present invention has been described in detail using specific embodiments, it is apparent to those skilled in the art that various modifications are possible without departing from the intention and the scope of the present invention.

REFERENCE SIGNS LIST

20 MULTI-BEAMS
32 STRIPE REGION
101 SAMPLE
102 ELECTRON COLUMN
103 WRITING CHAMBER
105 XY STAGE
110 CONTROL COMPUTER
200 ELECTRON BEAM
201 ELECTRON GUN
202 ILLUMINATION LENS
203 SHAPING APERTURE ARRAY SUBSTRATE
204 BLANKING APERTURE ARRAY MECHANISM
205 REDUCTION LENS
206 LIMITING APERTURE SUBSTRATE
207 OBJECTIVE LENS
208 MAIN DEFLECTOR
209 SUB DEFLECTOR

What is claimed is:

1. An effective temperature calculation method for multi-charged particle beam writing region, the effective temperature calculation method comprising:

a step of calculating, based on writing data, a dose amount of each of a plurality of pixels into which a writing region of a sample is divided, the sample being placed on a stage which moves during pattern writing;

a step of calculating an effective temperature of a mesh region of interest as a temperature calculation target by accumulating a temperature rise amount given to the mesh region of interest by a plurality of unit heat source regions around the mesh region of interest in a time domain in which a beam array region of a multi-charged particle beam passes through the mesh region of interest;

in the step of calculating the effective temperature, at a plurality of observation times which are irradiation end times of a tracking cycle in the time domain in which the beam array region passes through the mesh region of interest, for each of the plurality of unit heat source regions around the mesh region of interest, a temperature rise amount given to the mesh region of interest is determined based on a total irradiation time of the unit heat source region, times since start of irradiation to the unit heat source region to the observation times, and a distance from the unit heat source region to the mesh region of interest, the temperature rise amount is accumulated, and accumulated values corresponding to the plurality of observation times are averaged to calculate an effective temperature of the mesh region of the interest, and time integration of temperature is performed using a time structure in which irradiation of the multi-charged particle beam is pulse-like beam irradiation with a period of the tracking cycle.

2. The effective temperature calculation method for multi-charged particle beam writing region according to claim 1, wherein the unit heat source region has a greater size for a longer distance from the mesh region of the interest.

3. An effective temperature calculation method for multi-charged particle beam writing region, comprising:
   a step of calculating, based on writing data, a dose amount of each of a plurality of pixels into which a writing region of a sample is divided, the sample being placed on a stage which moves during pattern writing; and
   a step of calculating an effective temperature of a mesh region of interest as a temperature calculation target by accumulating a temperature rise amount given to the mesh region of interest by a plurality of unit heat source regions around the mesh region of interest in a time domain in which a beam array region of a multi-charged particle beam passes through the mesh region of interest,
   wherein in the step of calculating the effective temperature,
   a table stored in a storage is referenced, the table defining a temperature rise amount given by each unit heat source region in the writing region to a plurality of mesh regions into which the writing region is divided, for a plurality of combinations of a total irradiation time of the unit heat source region, a time elapsed since start of irradiation to the unit heat source region, and a distance from the unit heat source region, and
   at an observation time in a time domain in which the beam array region passes through the mesh region of interest, for each of the plurality of unit heat source regions around the mesh region of interest, a temperature rise amount is obtained from the table and accumulated, the temperature rise amount corresponding to the total irradiation time of the unit heat source region, the time since start of irradiation to the unit heat source region to the observation time, and the distance from the unit heat source region to the mesh region of interest.

4. The effective temperature calculation method for multi-charged particle beam writing region according to claim 3, wherein at a plurality of observation times in a time domain in which the beam array region passes through the mesh region of interest, a temperature rise amount is obtained from the table and accumulated, accumulated values corresponding the plurality of observation times are averaged to calculate an effective temperature of the mesh region of interest.

5. The effective temperature calculation method for multi-charged particle beam writing region according to claim 3, wherein the unit heat source region has a greater size for a longer distance from the mesh region of the interest.

* * * * *